US006292923B1

(12) United States Patent
Genrich et al.

(10) Patent No.: US 6,292,923 B1
(45) Date of Patent: *Sep. 18, 2001

(54) CONFIGURABLE INTERFACE MODULE

(75) Inventors: Thad J. Genrich; David W. Holsteen, both of Aurora; Bruno A. Martinez, Westminster; Daniel L. Spellman, Parker, all of CO (US)

(73) Assignee: Raytheon Company, Lexington, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/535,907

(22) Filed: Mar. 24, 2000

Related U.S. Application Data

(63) Continuation of application No. 08/515,775, filed on Aug. 16, 1995, now Pat. No. 6,113,260.

(51) Int. Cl.[7] .............................. H03M 13/03; G06F 7/38
(52) U.S. Cl. ...................... 714/795; 326/39; 430/825.83; 430/870.18; 375/341
(58) Field of Search .............................. 714/795; 326/39; 340/825.83, 870.18; 375/341

(56) References Cited

U.S. PATENT DOCUMENTS

| 4,910,692 | 3/1990 | Outram et al. .................. 364/550 |
|---|---|---|
| 5,117,756 | 6/1992 | Goffin, II . |
| 5,227,783 | 7/1993 | Shaw et al. .................... 340/870.19 |
| 5,347,548 | * 9/1994 | Messerges et al. ............. 375/371 |
| 5,394,031 | 2/1995 | Britton et al. ................. 326/38 |
| 5,504,454 | 4/1996 | Daggett et al. ................ 329/304 |
| 5,504,777 | 4/1996 | Hawkins et al. ............... 375/222 |
| 5,552,722 | 9/1996 | Kean ............................. 326/41 |
| 5,592,518 | 1/1997 | Davis et al. ................... 375/368 |
| 5,734,966 | * 3/1998 | Farrer et al. ................... 455/63 |

OTHER PUBLICATIONS

Varghese et al., "An Efficient Logic Emulation System", *IEEE Transactions on Very Large Scale Integration (VLSI) Systems*, vol. 1, No. 2, Jun. 1993, PA 171–174.

* cited by examiner

*Primary Examiner*—Emmanuel L. Moise
(74) *Attorney, Agent, or Firm*—Baker Botts L.L.P.

(57) ABSTRACT

A configurable interface module particularly suited for processing of digital and analog information includes at least one field programmable gate array (44, 46, 48) mounted on a mezzanine board (30) to provide functional flexibility and not requiring an additional slot in a computer chassis. In a preferred embodiment, the module is utilized to process weather information and performs the functions of demodulation, bit and frame synchronization, and FIFO buffer control. The gate arrays may be reprogrammed to implement either AM demodulation or BPSK demodulation or adapted to process other types of information, such as telemetry information.

16 Claims, 6 Drawing Sheets

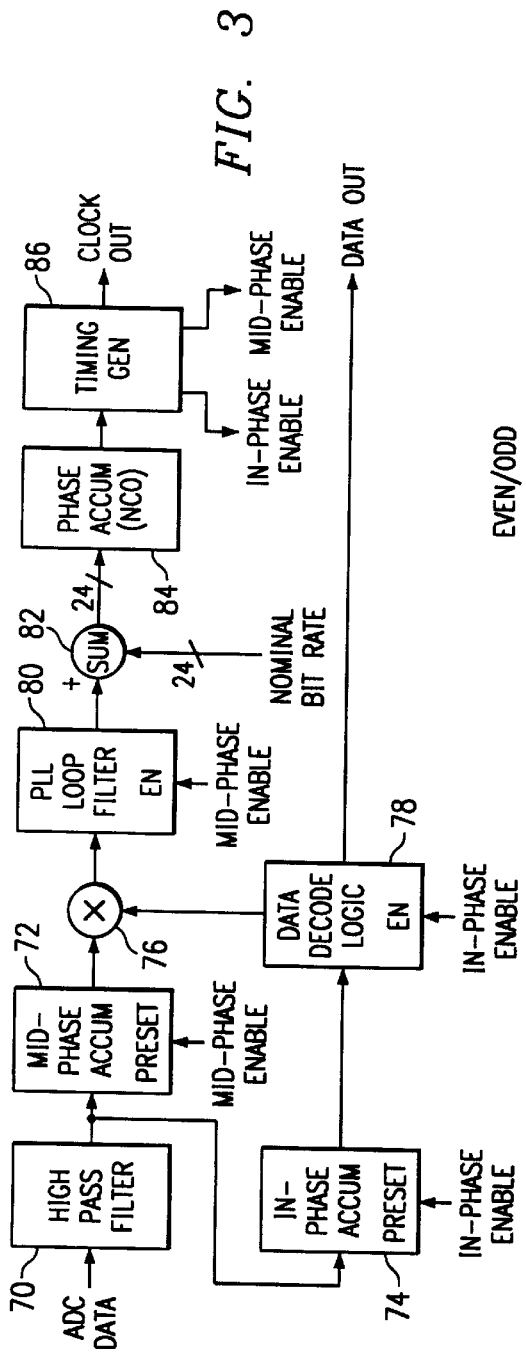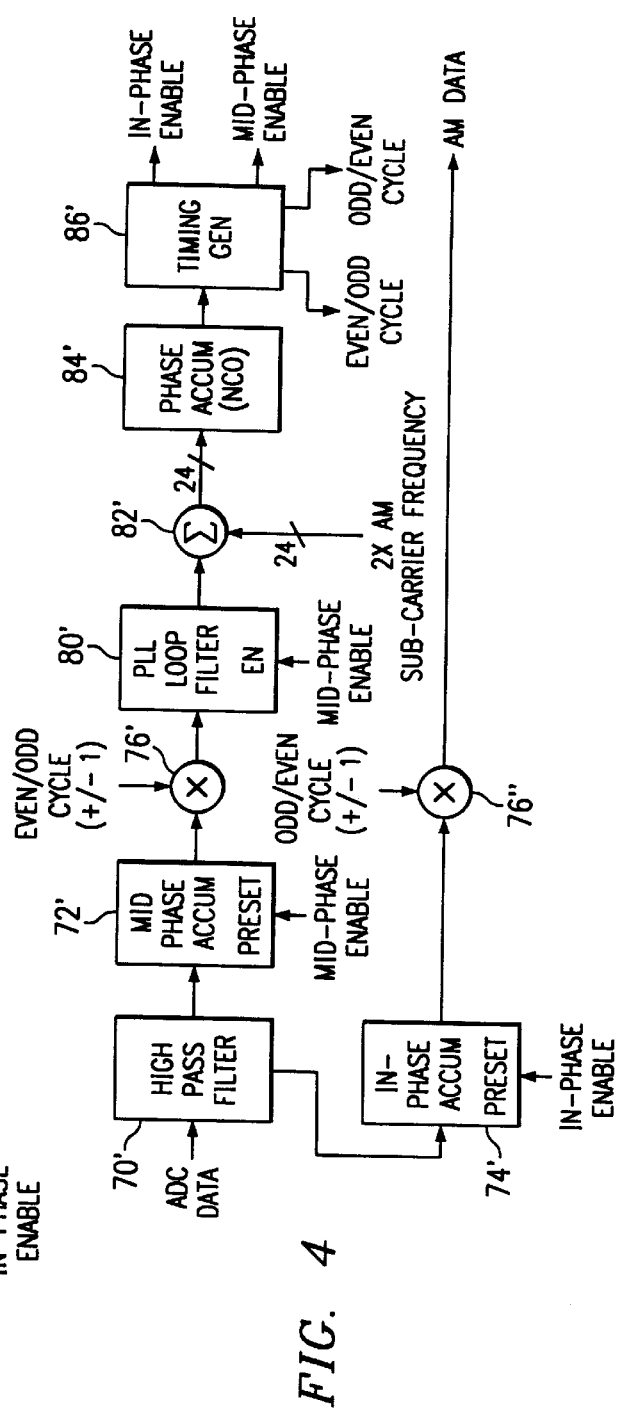
FIG. 3
FIG. 4

CONFIGURABLE INTERFACE MODULE

This application is a continuation of U.S. application Ser. No. 08/515,775 filed Aug. 16, 1995, now U.S. Pat. No. 6,113,260.

TECHNICAL FILED

The present invention relates to a configurable interface module particularly suited for acquisition and processing of weather information broadcast from weather satellites using field programmable gate arrays on a mezzanine board.

BACKGROUND ART

During the 1980's, the Versa Module European (VME) standard emerged to provide an open systems architecture in solving many of the problems with the form factor and interconnect method of earlier standards. VMEbus allows users to build a customized system in a standard chassis and backplane to suit their particular processing needs with off-the-shelf components with the assurance of interconnectivity and compatibility at the board level.

To further increase flexibility and provide additional processing functions while utilizing a single slot in the chassis, VMEbus carrier boards may include one or more connectors to accommodate electronic modules or mezzanine boards which may implement a wide variety of control, interface, input/output, analog, and digital functions. One example of such a mezzanine board is the INDUSTRY-PACK (IP) manufactured by GreenSpring Computers, Inc. of Menlo Park, Calif.

One application utilizing a VMEbus architecture to provide flexibility and configurability in acquisition and processing of weather data from various weather satellites is the PanThor system developed and manufactured by the assignee of the present invention. Similarly, a Satellite Processing Interface Unit (SPIU) produced by the assignee of the present invention is a dedicated unit which provides digital frame synchronization, FIFO data buffering, parallel digital input/output, and some computing capability for acquiring and processing weather information. Although the SPIU utilizes field programmable gate arrays (FPGA's), the SPIU does not provide functions such as bit synchronization and analog input which may be required to receive data from various environmental satellites.

SUMMARY OF THE INVENTION

Therefore, it is an object of the present invention to provide a configurable interface module particularly suited for use in acquiring weather-related information from various environmental satellites.

It is a further object of the present invention to provide a variety of interface functions for a commercially available mezzanine board having both digital and analog input capability.

A still further object of the present invention is to provide bit synchronization, Viterbi decoding, digital and analog frame synchronization, digitization, demodulation, parallel digital data input/output, and FIFO buffering on a commercially available mezzanine board.

Another object of the present invention is to provide a programmable configurable interface module on a commercially available mezzanine board which utilizes field programmable gate arrays to implement various analog and digital signal processing functions.

A still further object of the present invention is to provide a programmable interface module which automatically changes implementation of signal processing functions according to a predetermined program so as to accommodate different data formats at different times.

In carrying out the above objects and other objects and features of the present invention a configurable interface module is provided which includes an analog to digital converter in communication with at least one field programmable gate array which implements bit synchronization or demodulation, frame synchronization and data buffering functions on a commercially available mezzanine board. The mezzanine board is operatively associated with a carrier board to allow programming of the at least one array and processing of incoming data.

The advantages accruing to the present invention are numerous. For example, the present invention combines the functions of 2–4 prior art processing units on a single printed circuit assembly measuring only 3.6" by 3.9" in size. This reduces recurring costs and the mean time between failures (MTBF) since fewer components and connections are required. An interface module according to the present invention can be automatically reconfigured via a user-defined program within a system to handle several digital or analog input formats resulting in a lower number of spare parts required and providing increased system availability than previous approaches.

The above objects and other objects, features, and advantages of the present invention will be readily appreciated by one of ordinary skill in the art from the following detailed description of the best mode for carrying out the invention when taken in connection with the accompanying drawings.

BRIEF DESCRIPTION OF THE DRAWINGS

FIG. 3 is a block diagram of a bit synchronization function implemented by one of the FPGA's illustrated in FIG. 2 for receiving digital data;

FIG. 4 illustrates the FPGA of FIG. 3 after reconfiguration to implement an AM demodulator for receiving analog data according to the present invention;

BEST MODE FOR CARRYING OUT THE INVENTION

Figure 1:
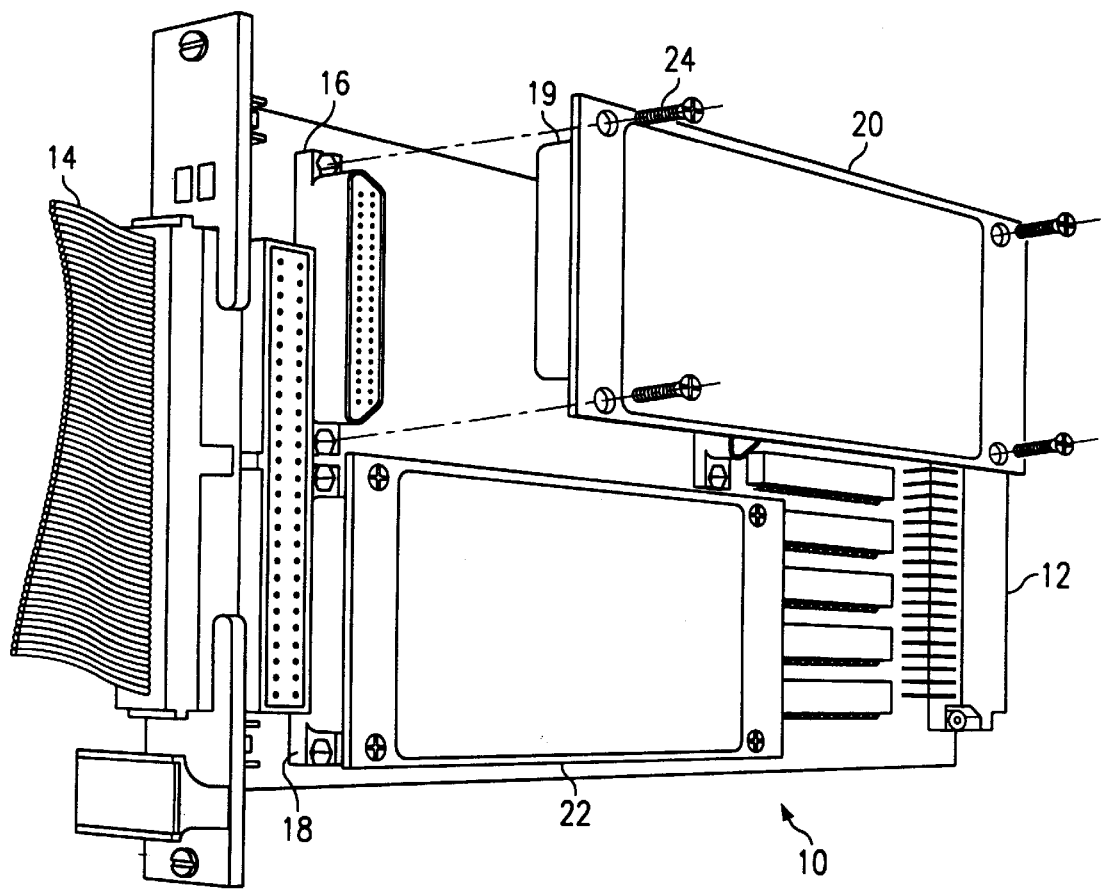
FIG. 1 illustrates typical single mezzanine boards mounted on a carrier board similar to the double mezzanine board utilized to provide a configurable interface module according to the present invention.

Referring now to FIG. 1, a typical VMEbus carrier board 10 is illustrated which communicates with a standard backplane (not specifically illustrated) of a chassis (not specifically illustrated) via connector 12. Board 10 may also be connected to various input and output devices via a ribbon cable 14 or the like. Board 10 includes at least one mechanical connector, such as connectors 16 and 18 which are adapted to receive corresponding connectors 19 on single mezzanine boards 20 and 22. Fasteners 24 may be used to secure mezzanine boards 20 and 22 to carrier board 10. The particular carrier board illustrated is referred to as a 3U or single VMEbus carrier board. In a preferred embodiment, a 6U or double VMEbus carrier board which accommodates two (2) double mezzanine boards (or four (4) single mezzanine boards).

In a preferred embodiment, a double INDUSTRYPACK mezzanine board is utilized and populated with a number of field programmable gate arrays (FPGA's) to implement various analog and digital signal processing functions as described in greater detail herein. Thus, the present invention provides functions which previously required an entire VMEbus board on a mezzanine board measuring only 3.6" by 3.9" in size.

Figure 2:
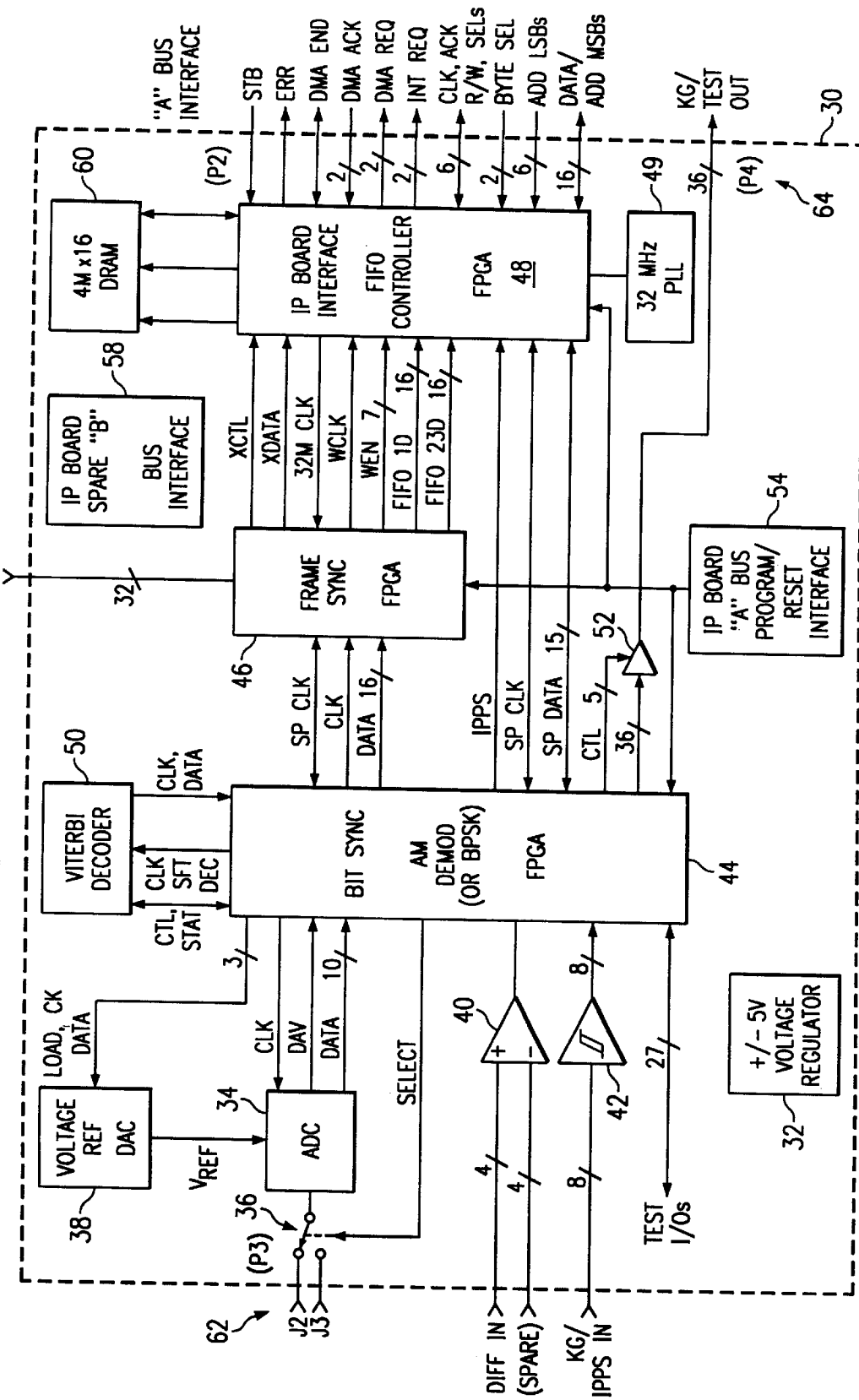
FIG. 2 is a schematic block diagram illustrating data and control flow for a configurable interface module according to the present invention.

Referring now to FIG. 2, a block diagram illustrating a configurable interface module (CIM) according to the present invention is shown. The interface module is implemented on a standard double mezzanine board 30 and is particularly suited for the acquisition and processing of weather data which may include various analog and digital image formats depending upon the particular environmental satellite which transmits the information. For example, the module may be programmed to receive analog information transmitted in the WEFAX format or the APT format as illustrated and described in greater detail with reference to FIGS. 7 and 8. Similarly, the module may be reconfigured (reprogrammed) automatically to receive digital information, such as information transmitted in the High Resolution Picture Transmission (HRPT) format.

Thus, the CIM may be programmed to receive digital information from a particular environmental satellite as it passes over a particular geographic region, and subsequently automatically reconfigured to receive analog information (or a different digital format) from a different environmental satellite.

With continuing reference to FIG. 2, a voltage regulator 32 provides a +/−5V supply voltage which is connected (not specifically illustrated for the sake of clarity) to the various integrated circuit chips on board 30. Mezzanine board 30 also includes an analog to digital converter (ADC) 34 which provides increased flexibility in allowing the CIM to receive either analog or digital signals. A programmable switch 36 allows analog data to be received through either of connectors 62 which are labeled J2 and J3 and are preferably 50Ω inputs P3 on the INDUSTRYPACK board. Voltage reference and digital-to-analog converter (DAC) 38 provides a fixed reference voltage ($V_{REF}$), which is +4V in a preferred embodiment, to ADC 36. voltage reference and DAC 38 also provides a variable offset voltage ($V_{OFF}$) to an analog video difference amplifier (not specifically illustrated) to level shift the output of the difference amplifier to an acceptable range for input to ADC 34.

A first FPGA 44 may be configured to provide bit synchronization or AM demodulation functions as illustrated and described in detail with reference to FIGS. 3–6. In an alternative embodiment, the CIM may be configured to implement a bit synchronizer and a programmable binary phase shift keying (BPSK) demodulator which is capable of data rates ranging from one kbps to 2.5 Mbps. In a preferred embodiment, the first FPGA 44 is a commercially available SRAM-based 15,000 gate array. FPGA 44 also receives inputs from differential line receiver 40 and a single-ended line receiver with hysteresis 42 which provides a one pulse per-second (PPS) serial clock and decryptor input. Likewise, FPGA 44 provides a 36 bit decryptor/test output bus through line driver 52.

As also shown in FIG. 2, first FPGA 44 is also in communication with a Viterbi decoder 50. As is well known in the art, Viterbi decoders provide an improved estimate of the proper sequence for a received digital signal which may be corrupted due to random channel noise or multi-path noise. In essence, these decoders provide error detection and correction of incoming digital data, such as video information, weather information, or the like. The demodulator and bit synchronization implementations are illustrated and described in greater detail herein with reference to FIGS. 3–6.

With continuing reference to FIG. 2, a second FPGA 46 provides frame synchronization of incoming data. Frame synchronizer 46 communicates with bit synchronizer/demodulator 44 and with a third FPGA 48 which provides board interface and FIFO data buffer controller functions. In a preferred embodiment, FPGA 48 communicates with the carrier board through an INDUSTRYPACK "A" bus interface through connector port P2, as illustrated. Preferably, second FPGA 46 is a commercially available SRAM-based 7,000 gate array while third FPGA 48 is a commercially available 15,000 gate array. Of course, as FPGA technology continues to progress and more and more gates are available on a single chip, it may be desirable to implement the various data processing functions such as demodulation synchronization and data buffering on a single FPGA chip.

As also shown in FIG. 2, a 32 MHz phase-locked loop (PLL) 49 and memory 60 are also connected to board interface and FIFO controller FPGA 48. Preferably, memory 60 provides 1M sixteen bit words of memory for use in data buffering which is controlled by the FIFO controller implemented by FPGA 48. In a preferred embodiment, four (4) virtual data buffer FIFO's are implemented in memory 60. A programmable logic device (PLD) interface 54 allows programming of the FPGA's 44, 46, and 48 in addition to providing a readback function and a board reset.

Referring now to FIG. 3, a block diagram illustrating a bit synchronizer implemented in FPGA 44 (illustrated in FIG. 2) is shown. An ADC clock signal (not specifically illustrated) is used to provide synchronous operation of all function blocks. This block diagram assumes two's complement signal representations with word widths and alignments (bit shifts) not specifically illustrated.

Figure 5:
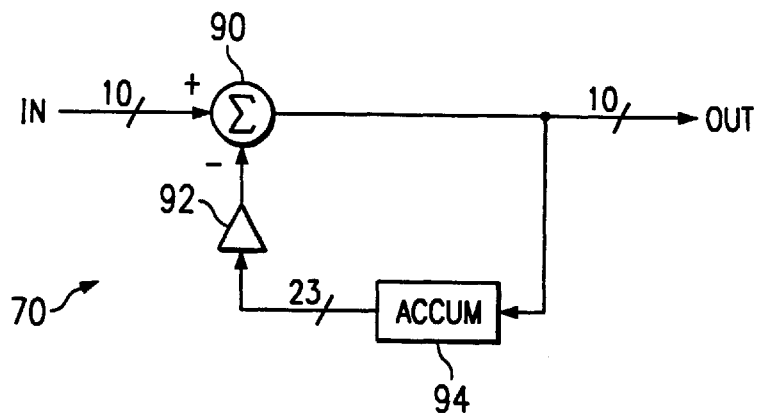
FIG. 5 is a block diagram of a high pass filter used in the bit synchronizer and AM demodulator illustrated in FIGS. 2–4.

ADC data is communicated from ADC 36 to high pass filter 70 (illustrated in greater detail in FIG. 5). The output from high pass filter 70 passes to mid-phase accumulator 72, which functions as a phase detector, and to in-phase accumulator 74, which functions as a data matched filter. This approach requires only two (2) accumulators compared to the usual three (3) for early/late gating.

The output of accumulator 72 passes to mid-phase output multiplier 76 -which is preferably implemented using a streamlined design. This input is multiplied by the output from data decoder logic 78 which provides an indication of the most recent and penultimate MSB (most significant bit) of in-phase accumulator 74. The output of the data decode logic 78 is unity if the most recent MSB was zero (indicating a positive value) while the output is zero if the most recent MSB was unity (indicating a negative value). The control line of multiplier 76 is set to zero if the penultimate and most recent MSB are the same, i.e. no data transition, +1 if the penultimate and most recent MSB indicate a data transition from low to high, and −1 if the data transition from high to low is indicated. In a preferred embodiment, the odd/even function (+/− 1) is performed by a selectable two's complementer and the zero function is implemented with a multiplexer. Alternatively, the zero function could be implemented with AND gates.

As also shown in FIG. 3, the output of multiplier 76 is filtered by phase-locked-loop filter 80 (best illustrated in FIG. 6) which has an enable input generated by timing generator 86. The output of filter 80 is combined with a nominal bit rate input by summer 82. The output of summer 82 is input to phase accumulator 84 before passing to timing generator 86. The clock output of timing generator 86 is the inverse of the MSB of phase accumulator 84. The in-phase enable output of timing generator 86 pulses high for one ADC clock cycle after the rising edge of the MSB of the output of phase accumulator 84. The mid-phase enable output of timing generator 86 pulses high after the falling edge of the MSB of the output of phase accumulator 84.

Referring now to FIG. 4, a block diagram illustrating an AM demodulator for receiving analog data is shown. According to the present invention, FPGA 44 may be dynamically reconfigured to implement either the bit synchronizer illustrated in FIG. 3 or the AM demodulator illustrated in FIG. 4. Components indicated by primed reference numerals correspond in structure and function to those components illustrated and described in detail with reference to FIG. 3. The block diagram of FIG. 4 implements a coherent amplitude modulation (AM) demodulator which locks to twice the AM subcarrier frequency to generate two output samples for each cycle of the AM subcarrier. The in-phase multiplier 76' and mid-phase multiplier 76" are selectable two's complementers. Timing generator 86' functions in a fashion similar to timing generator 86 for the bit synchronizer of FIG. 3 where the even/odd output is the inverse of the odd/even output, both of which toggle on every mid-phase enable.

Referring now to FIG. 5, a block diagram illustrating the high pass filter utilized in the AM demodulator/bit synchronizer of FIGS. 3–4 is shown. The high pass filter 70 includes a summer 90, a bit shifter 92, and an accumulator 94. High pass filter 70 is used to remove any DC bias on the input since the bit synchronizer and the AM demodulator would not function properly in the presence of an input DC bias. In a preferred embodiment, bit shifter 92 performs a $2^{-13}$ multiplication via hard-wired bit shifting.

Figure 6:
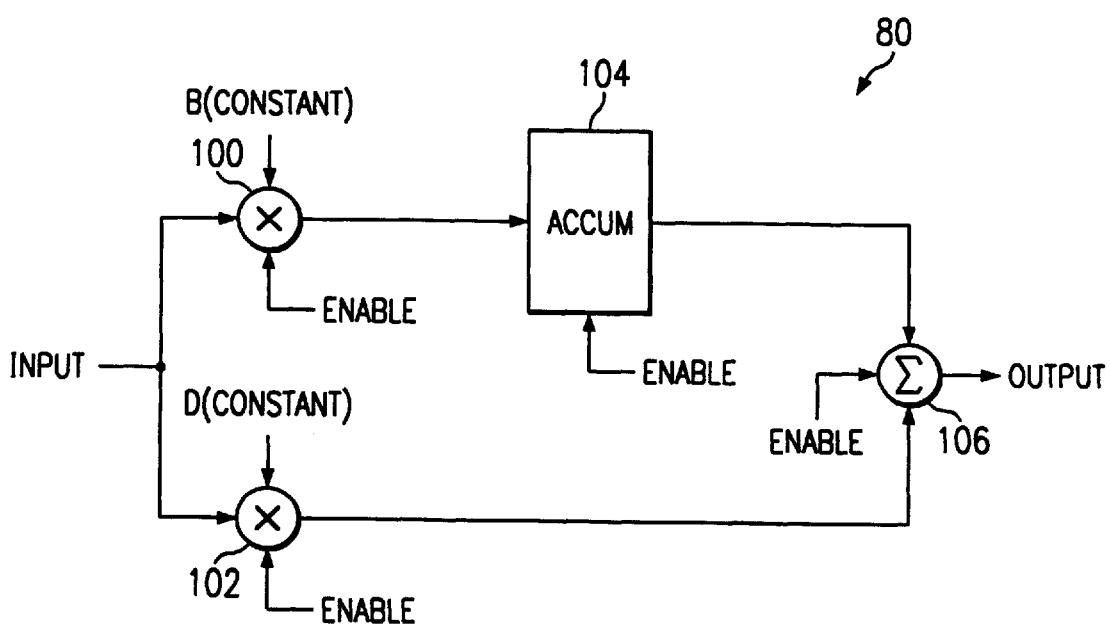
FIG. 6 is a block diagram of a PLL filter used in the bit synchronizer and AM demodulator illustrated in FIGS. 2–4.

Referring now to FIG. 6, a block diagram illustrating a loop filter for use by the bit synchronizer/demodulator of FIGS. 2–4 is shown. Loop filter 80 implements a Type II second order loop. The input to filter 80 is provided in parallel to multipliers 100 and 102 where it is multiplied by a first constant ("B") and a second constant ("D"), respectively. Preferably, multipliers 100 and 102 are of the 8×8 bit serial types which require a total of 8 clock cycles for each multiplication (performed concurrently). The output of multiplier 100 is input to accumulator 104. The outputs of accumulator 104 and multiplier 102 are input to summer 106 which provides the filter output. Application specific bit shifts (gain blocks) are not specifically illustrated.

Figure 7:
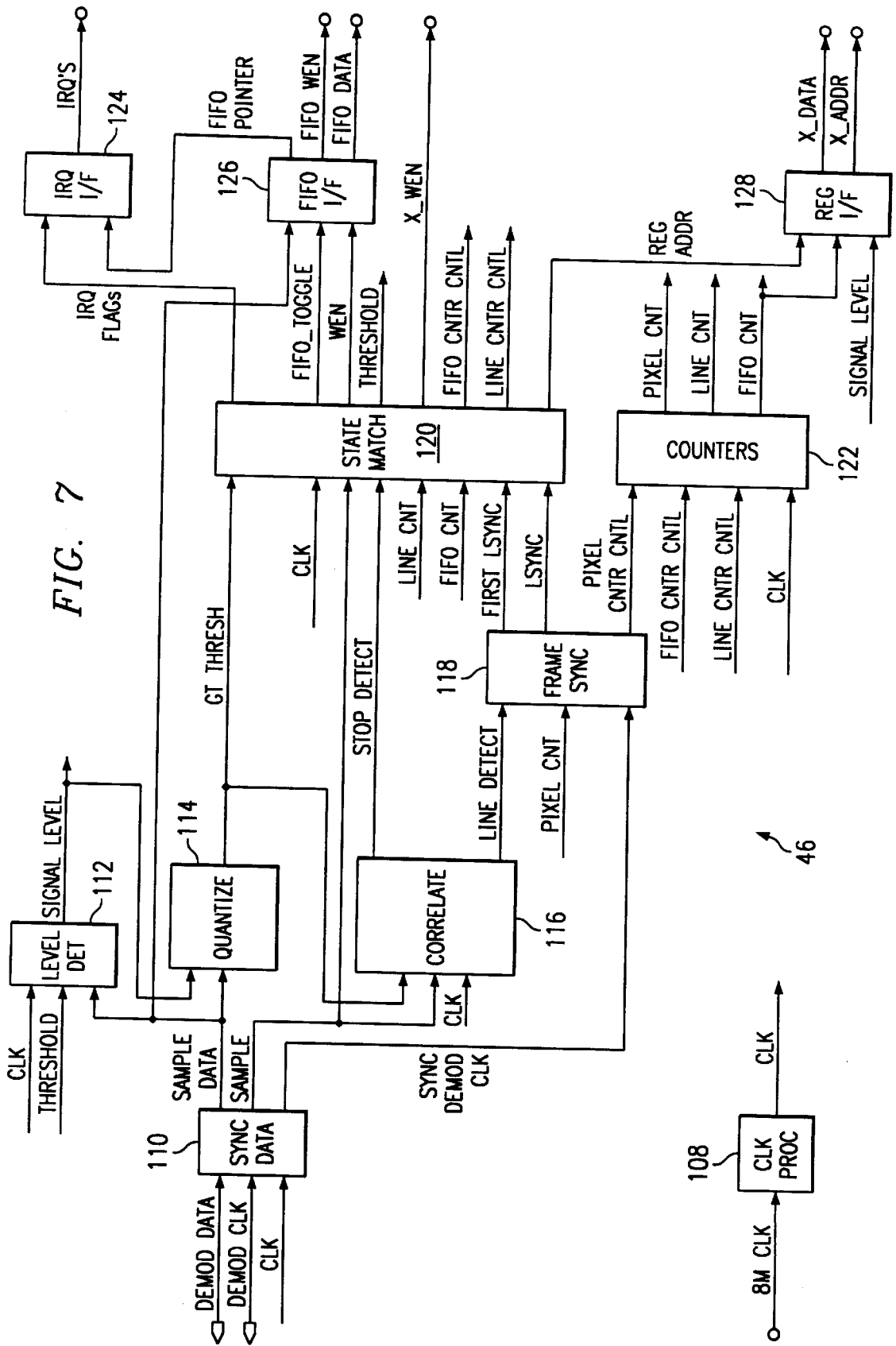
FIG. 7 is a block diagram of a frame synchronizer for use in receiving weather information transmitted in the weather facsimile (WEFAX) format.

Referring now to FIG. 7, a block diagram illustrating one configuration for a frame synchronizer according to the present invention is shown. The frame synchronizer 46 of FIG. 7 is designed to receive analog data in the WEFAX format. The input to frame synchronizer 46 is received by data synchronizer 110 which provides inputs to level detector 112, quantizer 114, correlator 116, frame syncrhonizer 118 and state machine 120. Level detector 112 provides a signal to quantizer 114 to adjust the threshold level provided to state machine 120 and correlator 116 based on the incoming signal. Correlator 116 and frame synchronizer 118 provide inputs to state machine 120 as illustrated. Interrupt request controller 124 writes status bits to the carrier board interface to indicate frame errors, and the like. The FIFO controller 126 interfaces with the data buffer to control data flow while register 128 provides status information in the form of a data pattern at a certain address in addition to the current state of the algorithm.

Figure 8:
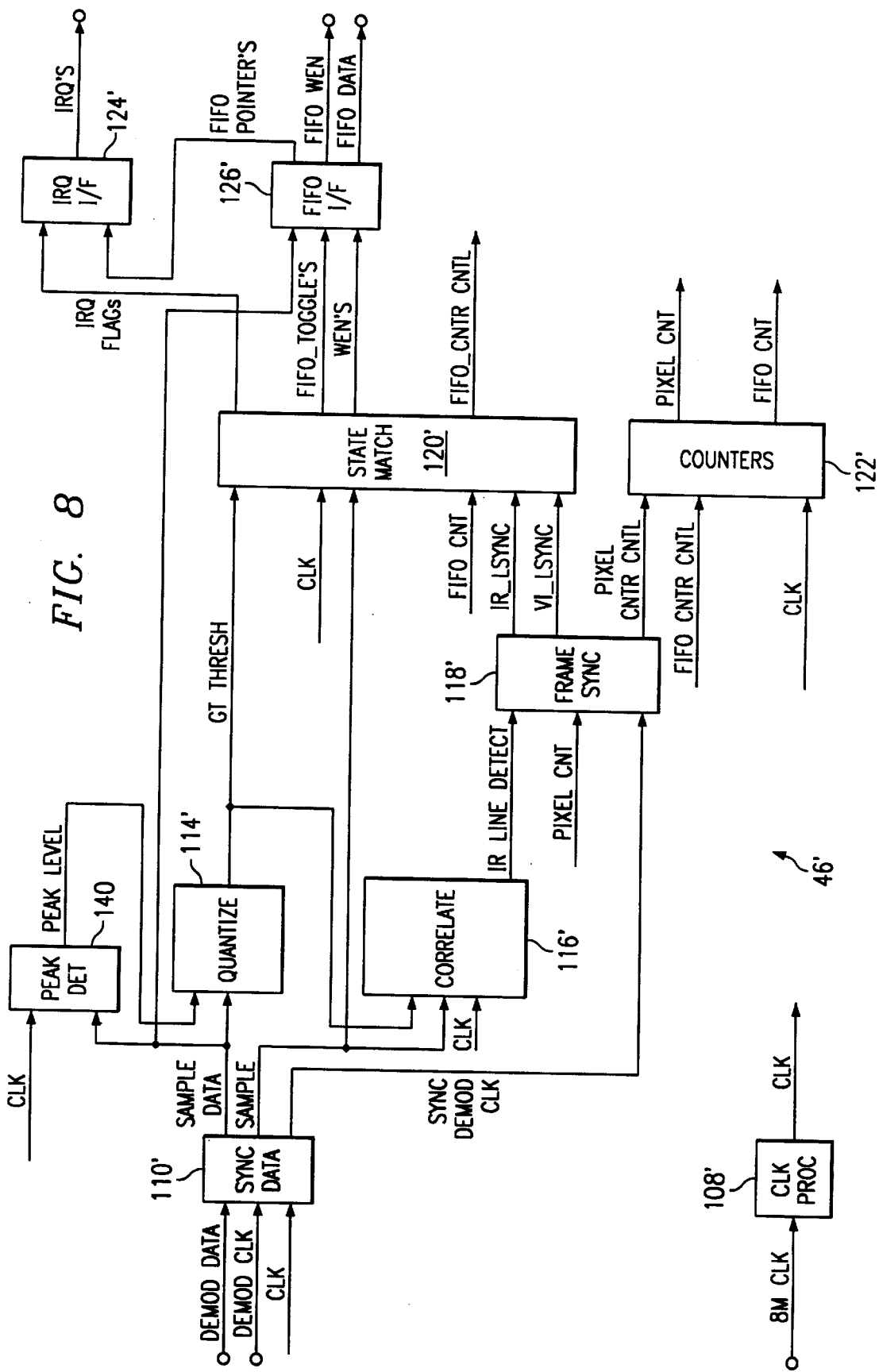
FIG. 8 is a block diagram of the FPGA of FIG. 7 after reconfiguration to implement a frame synchronizer for use in receiving weather information transmitted in the automatic picture transmission (APT) format.

Referring now to FIG. 8, a block diagram illustrating an alternative configuration for a frame synchronizer according the present invention is shown. The frame synchronizer 46' of FIG. 8 is designed to receive analog data in the APT format. As indicated by the primed reference numerals, many components of FIG. 8 are similar in structure and function to the corresponding components illustrated and described with reference to FIG. 7. As such, only differences between the frame synchronizer implementations are described here. For the APT format, a peak detector 140 replaces the level detector 112 utilized for the WEFAX format. Also, for the APT format, a component corresponding to register 128 is not required.

Alternatively, FPGA 46 may be selectively configured as a digital frame synchronizer. Digital frame synchronizers are discussed in greater detail in U.S. patent application Ser. No. 08/219,695 entitled "High Speed Parallel Frame Synchronizer" filed on Mar. 28, 1994, assigned to the assignee of the present invention, the disclosure of which is hereby incorporated by reference in its entirety. As described in that application, the control logic implements search, verify, lock, and flywheel modes. The control algorithm uses a counter to count all bits within the selected frame, i.e. between successive synchronization patterns. The serial data is then formatted into parallel words using bit timing from control logic according to the specified data format. Formatted data is then written into the buffer memory during the lock and flywheel states. A status controller writes status bits to the carrier board interface to indicate frame errors, algorithm state, and the like.

By utilizing FPGA's to implement the various analog and digital signal processing functions, the CIM of the present invention can be reconfigured to handle several digital or analog input formats. Since the CIM is mounted on an already required VMEbus computer module, it does not require additional chassis space. The module can also be used in IBM-PC or MACINTOSH systems using a COTS carrier board, or in a Sun computer with a custom carrier board. In addition to processing weather information, a CIM according to the present invention may be used to process other types of data which require similar functions, such as telemetry data.

It is understood, of course, that while the forms of the invention herein shown and described include the best mode contemplated for carrying out the present invention, they are not intended to illustrate all possible forms thereof. It will also be understood that the words used are descriptive rather than limiting, and that various changes may be made without departing from the spirit or scope of the invention as claimed below.

What is claimed is:

1. A programmable interface module, comprising:

at least one input device and at least one output device; and at least one field programmable gate array (FPGA) connected to the at least one input device and the at least one output device, programming information applied to at least one input device enables programming of the at least one FPGA and processing of incoming data, wherein the at least one FPGA implements synchronization, demodulation and buffer control of the incoming data, with at least one of the FPGAs reprogrammable for frame synchronization of either analog or digital information.

2. The interface module of claim 1 wherein the at least one FPGA comprises three FPGAs and wherein the first FPGA includes programming to selectively implement bit synchronization or demodulation, the second FPGA implements frame synchronization, and the third FPGA implements data buffer control.

3. The interface module of claim 1 further comprising:
a decoder connected to at least one input device and with at least one FPGA for providing error detection and correction of the incoming data.

4. The interface module of claim 1 further comprising a memory connected to the at least one input device and with the at least one FPGA, the memory providing buffering of incoming data.

5. The interface module of claim 1 further comprising a programmable logic interface connected to the at least one input device to enable automatic external reconfiguration of the at least one FPGA without user intervention to implement one function selected from the group consisting of bit synchronization and demodulation.

6. The interface module of claim 1 wherein the at least one FPGA includes an FPGA programmable to implement bit synchronization, said bit synchronization FPGA including a high pass filter for filtering input digital bit synchronization data, a mid-phase accumulator functioning as a phase detector for the filtered data, an in-phase accumulator functioning as a data matched filter for the filtered data and provides an output from the bit synchronization array, and a timing generator generating enable signals to preset said mid-phase and in-phase accumulators as a function of the accumulator outputs and of a nominal bit rate input.

7. A configurable interface module, comprising:
at least one input device and at least one output device; and
a plurality of field programmable gate arrays (FPGAs) connected selectively to at least one input device and/or at least one output device to allow programming of the plurality of FPGAs and processing of incoming information, wherein the plurality of FPGAs receive programming information to selectively implement digital and analog signal processing functions including bit synchronization, demodulation, frame synchronization and incoming data buffer control, with at least one of the FPGAs reprogrammable for frame synchronization of either analog or digital information.

8. The interface module of claim 7 further comprising:
a Viterbi decoder connected to at least one input device and at least one of the plurality of FPGAs for providing error detection and correction of the incoming data; and
a memory connected to at least one of the FPGAs to provide data buffering.

9. The interface module of claim 7 wherein one of said plurality of FPGAs performs bit synchronization, said bit synchronization FPGA including a high pass filter for filtering input digital bit synchronization data, a mid-phase accumulator functioning as a phase detector for the filtered data, an in-phase accumulator functioning as a data matched filter for the filtered data and provides an output from the bit synchronization array, and a timing generator generating enable signals to preset said mid-phase and in-phase accumulators as a function of the accumulator outputs and of a nominal bit rate input.

10. A method of configuring an interface module, comprising:
programming one or more field programmable gate arrays (FPGAs) populating a support board of the interface module to receive analog information transmitted in selected formats;
reprogramming one or more of the FPGAs to receive digital information in a selected format; and
applying programming information to the interface module to selectively program the FPGAs to alternately receive analog information or digital information.

11. The method of configuring an interface module as in claim 10, further comprising:
applying programming information to the FPGAs when programmed to receive digital information to provide bit synchronization.

12. The method of configuring an interface module as in claim 11, further comprising:
applying programming information to the interface board when programmed to receive digital information to provide frame synchronization in addition to bit synchronization.

13. The method of configuring an interface module as in claim 12, further comprising:
applying programming information to the interface module, then programming to receive digital information to provide first-in-first-out (FIFO) data buffer control.

14. The method of configuring an interface module as in claim 10, further comprising:
applying programming information to the interface module when programmed to receive analog information to provide AM demodulation.

15. The method of configuring an interface module as in claim 10, further comprising:
applying programming information to the interface module when programmed to receive digital information to provide a programmable Binary Phased Shift Keying (BPSK) demodulator.

16. The method of configuring an interface module as in claim 10, further comprising:
applying programming information to the FPGAs when programmed to receive digital information to provide error detection and correction of incoming digital signals.

* * * * *